United States Patent
Qiu et al.

(10) Patent No.: US 9,881,687 B2
(45) Date of Patent: Jan. 30, 2018

(54) SELF-LATCH SENSE TIMING IN A ONE-TIME-PROGRAMMABLE MEMORY ARCHITECTURE

(71) Applicant: Texas Instruments Incorporated, Dallas, TX (US)

(72) Inventors: Yunchen Qiu, Plano, TX (US); David J. Toops, Lucas, TX (US); Harold L. Davis, The Colony, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/247,352

(22) Filed: Aug. 25, 2016

(65) Prior Publication Data

US 2017/0178742 A1    Jun. 22, 2017

Related U.S. Application Data

(60) Provisional application No. 62/269,737, filed on Dec. 18, 2015.

(51) Int. Cl.
*G11C 17/18*    (2006.01)
*G11C 17/16*    (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
See application file for complete search history.

(56) References Cited

U.S. PATENT DOCUMENTS

| | | | | |
|---|---|---|---|---|
| 6,618,313 B2* | 9/2003 | Nguyen | .................... | G11C 7/22 365/194 |
| 7,102,934 B1* | 9/2006 | Cruz | ...................... | G11C 7/065 365/185.25 |
| 7,499,347 B2 | 3/2009 | Chen et al. | | |
| 8,363,499 B2* | 1/2013 | La Rosa | ................ | G11C 7/065 365/205 |
| 8,773,166 B1* | 7/2014 | Gaide | .............. | H03K 19/01759 326/38 |
| 2013/0194856 A1 | 8/2013 | Forejt et al. | | |
| 2014/0010032 A1 | 1/2014 | Seshadri et al. | | |

OTHER PUBLICATIONS

Amrutur et al., "A Replica Technique for Wordline and Sense Control in Low-Power SRAM's", J. Solid State Circ., vol. 33, No. 8 (IEEE, 1998), pp. 1208-1219.
Arslan et al., "Variation-Tolerant SRAM Sense-Amplifier Timing Using Configurable Replica Bitlines", Paper 16-4-1, Custom Integrated Circuits Conference (IEEE, 2008), pp. 415-418.

* cited by examiner

*Primary Examiner* — Tri Hoang
(74) *Attorney, Agent, or Firm* — Kenneth Liu; Charles A. Brill; Frank D. Cimino (57) ABSTRACT

A programmable memory including a self-latching read data path. A sense amplifier senses the voltage level at a bit line, the bit line communicating the data state of a selected memory cell in its associated column. A data latch coupled to the output of the sense amplifier passes the sensed data state. Set-reset logic is provided that receives the output of the data latch in the read data path and, in response to a transition of the data state in a read cycle, latches the data latch and isolates it from the sense amplifier. The set-reset logic resets the data latch at the start of the next read cycle. In some embodiments, a timer is provided so that the latch is reset after a time-out period in a long read cycle in which no data transition occurs.

9 Claims, 7 Drawing Sheets

SELF-LATCH SENSE TIMING IN A ONE-TIME-PROGRAMMABLE MEMORY ARCHITECTURE

CROSS-REFERENCE TO RELATED APPLICATIONS

This application claims priority, under 35 U.S.C. § 119(e), of Provisional Application No. 62/269,737, filed Dec. 18, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memories. Embodiments of this invention are more specifically directed to the sensing of stored data states in one-time programmable non-volatile memory.

Non-volatile solid-state read/write memory devices are commonplace in many modern electronic systems, particularly in portable electronic devices and systems. Conventional types of non-volatile solid-state memory devices include those referred to as electrically programmable read-only memory (EPROM) devices. Modern EPROM memory cells include one or more "floating-gate" transistors that store the data state. In a general sense, these floating-gate transistors are "programmed" by the application of a bias that enables holes or electrons to tunnel or be injected through a thin dielectric film onto an electrically isolated transistor gate element, which is the floating gate of the transistor. This trapped charge on the floating gate will modulate the apparent threshold voltage of the memory cell transistor, as compared with the threshold voltage with no charge trapped on the floating gate. This difference in threshold voltage can be detected by sensing the resulting difference in source-drain conduction, under normal transistor bias conditions, between the programmed and unprogrammed states. Some EPROM devices are "erasable" in that the trapped charge can be removed from the floating gate, for example by exposure of the memory cells to ultraviolet light (such memories referred to as "UV EPROMS") or by application of a particular electrical bias condition that enables tunneling of the charge from the floating gate (such memories referred to as electrically-erasable or electrically-alterable, i.e., EEPROMs and EAPROMS, respectively). "Flash" memory devices are typically realized by EEPROM memory arrays in which the erase operation is applied simultaneously to a "block" of memory cells.

Because of the convenience and efficiency of modern EPROM and EEPROM functions, it is now commonplace to embed non-volatile memory arrays within larger scale integrated circuits, such as modern complex microprocessors, digital signal processors, and other large-scale logic circuitry. Such embedded non-volatile memories can be used as non-volatile program memory storing software routines executable by the processor, and also as non-volatile data storage. On a smaller scale, non-volatile memory cells can realize control registers by way of which a larger scale logic circuit can be configured, or can be used to "trim" analog levels after electrical measurement.

As known in the art, "one-time programmable" ("OTP") memories are also popular, especially in embedded non-volatile memory applications as mentioned above. The memory cells of OTP memories are constructed similarly or identically as UV EPROM cells, and as such are not electrically erasable. But when mounted in an opaque package, without a window through which the memory can be exposed to ultraviolet light, the UV EPROM cells may be programmed one and only one time. In embedded applications, OTP memories are useful for storing the program code to be executed by the embedding microcontroller or microprocessor.

In any type of solid-state semiconductor memory, data path timing for the read operation is critical in the performance of the memory device. As fundamental in the art, memory cells in conventional OTP and other solid-state memories are typically accessed by selecting a row of cells in the array according to a row address, coupling the storage device in each of those cells to a corresponding bit line to establish a voltage or current on each bit line according to the data state stored in its corresponding cell. Sense amplifiers sense the state of the bit lines to determine the data states of the accessed cells, and these sensed data states are then latched and communicated along the output data path of the memory. Accurate sensing of the stored memory cell state must be maintained over varying voltage and temperature conditions, variations in manufacturing parameters, and in the presence of system noise. As known in the art, the noise margin of the read operation, which depends on timing precision in the read circuitry, in large part determines the minimum memory cell size required to provide the necessary read current and thus the memory density in bits per unit "chip" area.

This precision of the sense circuitry is due in large part to the timing at which the sense amplifiers operate to amplify and latch the data state represented by the bit line signals. In each cycle, time must be provided to allow the accessed memory cells to develop a voltage or current on the bit lines, before the amplification and latching of those bit line levels as the data states read from the accessed cells. On one hand, if the data are latched too early in the cycle, before the bit line signal has fully developed, the data read is vulnerable to error from noise. On the other hand, latching the data later than is necessary for reliable sensing will unduly lengthen the read cycle time and thus limit the performance of the device.

It has been observed that the optimization of data path timing for read cycles in modern memory architectures can be quite difficult. One conventional technique for setting the read path timing is to generate a sense amplifier enable signal from a row enable control signal that gates the word line drivers, but with a delay element such as a chain of logic inverters establishing the desired delay time following the driving of the selected word line before the sense amplifiers are enabled or sensed data are latched. It has been observed, however, that the construction and thus the electrical characteristics of the memory cell transistors typically differ from that of the logic transistors making up the delay element. Significant device mismatch can result which, along with localized variations in device behavior of these minimum size cell transistors, necessitates additional design margin (i.e., lengthened delay between the word line drive and the sense amplifier enable signal) to be built into the timing circuit. This additional margin adversely impacts read cycle times.

Another conventional approach to determining sense amplifier timing in modern solid-state memories uses a "tracking" circuit based on replica, or "dummy", memory cells that are constructed using the same transistor sizes as the cell transistors. This approach is especially common in those memory technologies for which the replica cells can closely match the cell transistors in the main array, such as static random access memories (SRAMs). Arslan et al., "Variation-Tolerant SRAM Sense-Amplifier Timing Using Configurable Replica Bitlines", *Custom Integrated Circuits Conference* (IEEE, 2008), pp. 415-418, describes the incorporation of a replica column of memory cells implemented in or adjacent to the main memory array, in which the discharge of the replica bit line by a configurable number of dummy memory cells in that column drives the sense amplifier enable signal. Amrutur et al., "A Replica Technique for Wordline and Sense Control in Low-Power SRAM's", *J. Solid State Circuits*, Vol. 33, No. 8 (IEEE, 1998), pp. 1208-19, describes a row of replica cells implemented in or adjacent to the main memory array, for which a dummy global word line is driven along with the global word line for the main array.

In some memory architectures, such as those used in conventional one-time-programmable (OTP) memory, the tracking circuit determines the time at which a data latch receiving the output of the sense amplifiers is enabled. In one conventional OTP architecture, the sense amplifier responds asynchronously to the bit line levels to produce an output level that is latched into a read data latch at a point in the cycle determined by the tracking circuit.

Figure 1:
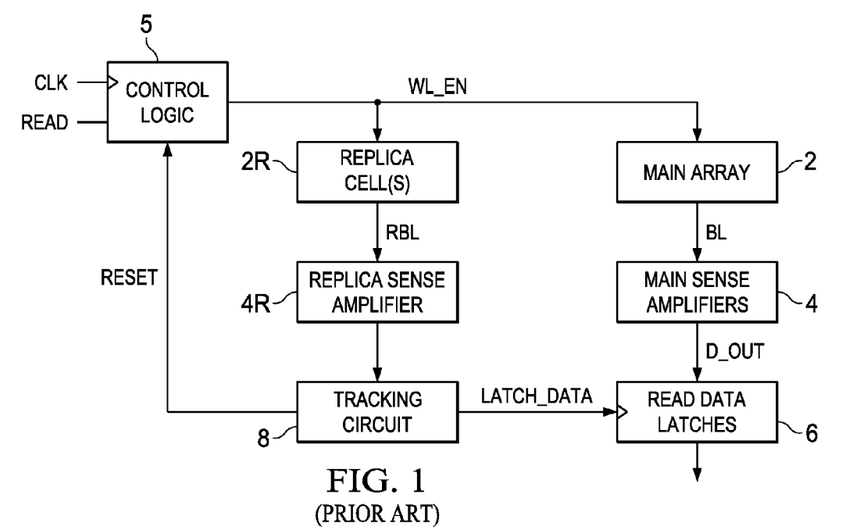
FIG. 1 is an electrical diagram, in block form, of the functional architecture of a conventional one-time programmable (OTP) memory.

FIG. 1 illustrates the functional architecture of a conventional OTP memory including a tracking circuit for timing the latching of the data sensed by sense amplifiers. In this conventional architecture, the OTP bit cells are arranged as rows and columns in main array 2, with the cells in the same row sharing a word line and those in the same column sharing a bit line BL, coupled to a corresponding one of main sense amplifiers 4. Control logic 5 represents timing logic circuitry that generates a word line enable signal WL_EN that gates the row decoder and word line drivers (not shown) to energize the selected word line in main array 2 in the read cycle (indicated by read enable signal READ), at the appropriate time responsive to a clock signal CLK. In the manner discussed above, main sense amplifiers 4 asynchronously sense the state of bit lines BL and present corresponding output signals indicating the sensed data states to read data latches 6. In this conventional OTP architecture, read data latches 6 latch the output data D_OUT presented by main sense amplifiers 4 in response to a LATCH_DATA signal. Tracking circuit 8 also generates a reset signal RESET to control logic 5 at this time, to allow the memory to prepare for the next cycle once the output data are latched at interval t2-t1 from read data latches 6.

According to this conventional OTP architecture, the timing of the LATCH_DATA signal is derived from a tracking circuit 8 that tracks the sensing of a data level stored at one or more replica memory cells 2R following the energizing of the word line enable signal WL_EN. Each replica cell 2R is typically hard-wired to a particular data state, and is coupled to replica bit line RBL as word line enable signal WL_EN is energized. If multiple replica cells 2R are used, these cells 2R are typically ganged together along one or more replica bit lines RBL to minimize the effects of local device variation. Replica sense amplifier 4R issues a signal to tracking circuit 8 in response to a transition at replica bit line RBL. Tracking circuit 8 in turn generates the LATCH_DATA signal, which is (theoretically) at the time that replica sense amplifier 4R produces a stable D_OUT state from the levels at replica bit lines RBL, plus an additional time margin to allow for variation over main array 2. For the reasons discussed above, the timing of this LATCH_DATA signal is critical in the overall performance of this OTP memory. If the LATCH_DATA signal is applied to latches 6 too early in the cycle, the noise margin of the read operation is poor; if it is applied too late in the cycle, the cycle time of the memory is degraded.

It has been observed, however, that conventional tracking circuit approaches are limited in the precision with which sense amplifier or data latch timing can be attained in one-time programmable (OTP) memories. As known in the art, the electrical behavior of OTP memory cells changes over the life of the device, for example because the charge stored at the floating gate of the bit cell transistor leaks or is otherwise weakened. This change in behavior is typically reflected in degradation of the read performance of a programmed (i.e., "1" data state) cell over time. Unfortunately, referring to FIG. 1, replica OTP cells 2R will degrade differently over time than will the average cells in main array 2, if for no other reason because replica cells 2R are accessed in each and every read cycle, while cells in main array 2 are accessed much less frequently, on average.

Figure 2A:
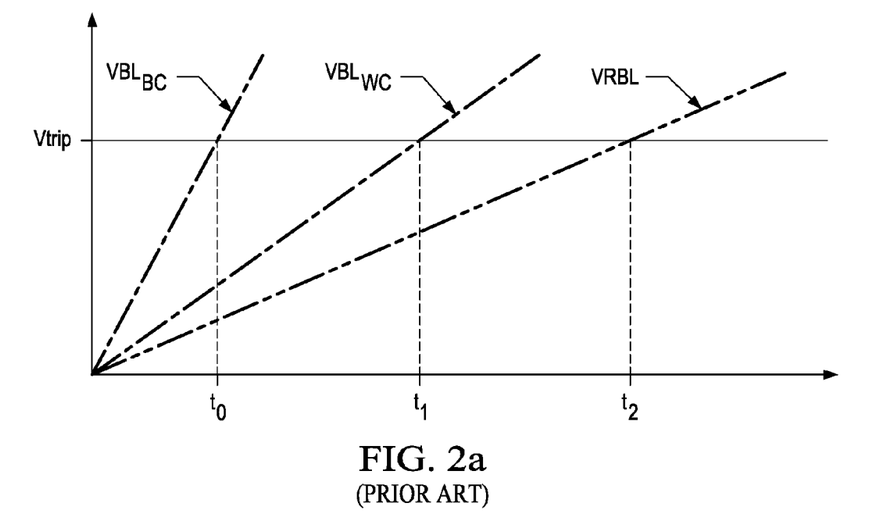
FIG. 2a is a plot illustrating sense amplifier response to bit line voltage in a conventional OTP memory.

To avoid the resulting variation in read performance over time, many conventional OTP memories realize replica cells 2R as non-programmable transistors, for example as p-channel MOS load transistors, so that the timing of the LATCH_DATA signal is invariant over the device life. However, the use of different transistor types and arrangements for replica cells 2R from those of the cells in main array 2 results in the tracking circuit and the actual data path exhibiting different behavior over variations in power supply voltage, temperature, and process parameters. FIG. 2a qualitatively illustrates the effect of variations in these parameters on the timing determination in the OTP memory of FIG. 1. In this example of FIG. 2a, plot $VBL_{BC}$ exhibits the bit line voltage $VBL_{BC}$ for a "0" to "1" transition following energizing of the selected word line in main array 2 for a "best case" condition of power supply voltage, temperature, and process parameters. As shown in FIG. 2a, this bit line voltage $VBL_{BC}$ reaches a trip voltage Vtrip at a time to, at which time the LATCH_DATA signal may be issued to read data latches 6 to accurately latch the output D_OUT of sense amplifiers 4. The "worst case" condition of voltage, temperature, and process on the development of the bit line voltage in this OTP memory is shown by plot $VBL_{WC}$, which reaches the trip voltage Vtrip at a later time $t_1$.

While the tracking circuit may be arranged to issue the LATCH_DATA signal at any time following worst case time $t_1$, the construction of replica cells 2R from different transistors than the memory cell devices in the main array 2 necessitates the implementation of some timing margin to account for the eventual degradation of the main array cells over system life. Accordingly, the arrangement of replica cells 2R, replica sense amplifier 4R, and tracking circuit 8 in this conventional OTP memory is typically arranged so that the time at which the reference bit line voltage VRBL reaches the trip voltage Vtrip is later than the worst case time $t_1$ for main array 2. FIG. 2a shows an example of this slower development of the reference bit line voltage VRBL, reaching trip voltage Vtrip at time $t_2$.

Figure 2B:
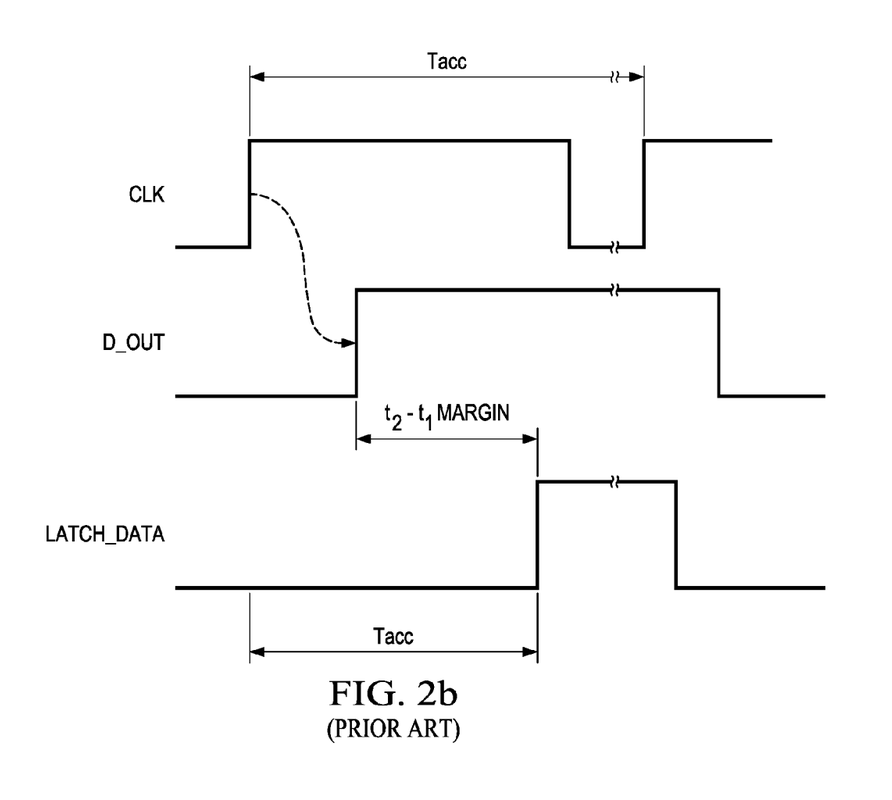
FIG. 2b is a timing diagram illustrating the sense amplifier and data latch timing in a conventional OTP memory.

This margin provided by the interval $t_2$-$t_1$ directly impacts the cycle time of the memory. FIG. 2b illustrates the generation of a stable "1" level at the output D_OUT of sense amplifiers 4 following the issuance of the clock signal CLK to control logic 5 in this architecture. The timing margin indicated by time interval $t_2$-$t_1$, after the worst case time at which the reference bit line voltage VRBL reaches the trip voltage Vtrip, accounts for degradation of the main array cells over device life. In current-day OTP memories, this $t_2$-$t_1$ margin can range from 30 nsec to as much as 100 nsec, depending on memory size. This margin interval $t_2$-$t_1$ can be a significant fraction of the overall cycle time Tcyc of the memory, and thus can affect the overall performance of the device.

BRIEF SUMMARY OF THE INVENTION

Disclosed embodiments provide a timing architecture for the read data path in one-time programmable (OTP) memories in which memory cycle time is minimized.

Disclosed embodiments provide such a memory architecture in which the timing of the read data path adjusts with changes in bit cell performance over the operating life of the memory.

Disclosed embodiments provide such a memory architecture requiring minimal timing margin to account for cell degradation.

Disclosed embodiments provide such a memory architecture in which the read power consumption is reduced.

Disclosed embodiments provide such a memory architecture that can be realized by less complex circuitry than in conventional memories.

Other objects and advantages of the disclosed embodiments will be apparent to those of ordinary skill in the art having reference to the following specification together with its drawings.

According to certain embodiments, a programmable memory includes a read data path in which a transition in the data path itself is used to latch the data state sensed from an accessed memory cell. Latch set-reset logic is provided so that, in a read operation, a transition at the output of a sense amplifier caused by a selected memory cell storing a programmed cell state, clocks a data latch to store that data state and to isolate its input from the sense amplifier. The latch set-reset logic resets the data latch at the start of the next read cycle. In some embodiments, a timer is provided so that the latch is reset after a time-out period in a long read cycle in which no data transition occurs.

DETAILED DESCRIPTION OF THE INVENTION

The one or more embodiments described in this specification are implemented into a one-time programmable (OTP), electrically programmable, read only memory, such as may be implemented into a microcontroller or other large scale integrated circuits, as it is contemplated that such implementation is particularly advantageous in that context. However, it is also contemplated that concepts of this invention may be beneficially applied to other applications, for example stand-alone OTP memory devices, as well as other memory technologies, particularly those for which tracking cells may not match the main memory cells in electrical characteristics and performance. Accordingly, it is to be understood that the following description is provided by way of example only, and is not intended to limit the true scope of this invention as claimed.

Figure 3:
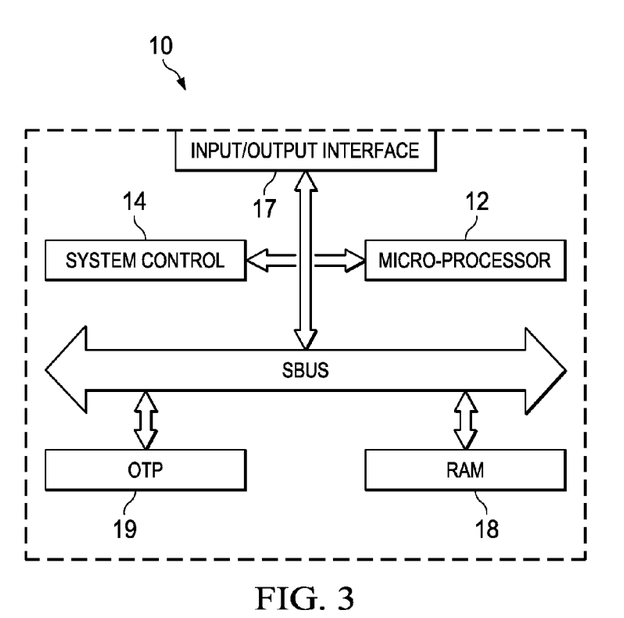
FIG. 3 is an electrical diagram, in block form, of a large scale integrated circuit including an OTP memory constructed according to embodiments.

FIG. 3 illustrates an example of large-scale integrated circuit 10 in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes microprocessor 12, which is connected to system bus SBUS and serves as the central processing unit of the device. Various memory resources, including random access memory (RAM) 18 and one-time programmable read-only memory (OTP) 19, reside on system bus SBUS and are thus accessible to microprocessor 12.

In this example, OTP 19 is of a type that may be erasable by exposure to ultraviolet light, namely as a UV EPROM. In this example, if integrated circuit 10 is packaged in a conventional opaque package, OTP 19 may be programmed once after being packaged but cannot be erased. Alternatively, as will be mentioned below, if integrated circuit 10 is packaged with a window by way of which the memory array of OTP 19 is visible, OTP 19 may serve as a UV EPROM. Other implementations of this non-volatile memory shown in FIG. 3 as OTP 19 are contemplated, including electrically-erasable and flash implementations. In any case, OTP 19 in FIG. 3 is contemplated to typically serve as program memory storing the program instructions executable by microprocessor 12, while RAM 18 serves as data memory. In some cases, program instructions may reside in RAM 18 for recall and execution by microprocessor 12. Other system functions are shown in integrated circuit 10 in a generic sense, by way of system control 14 and input/output interface 17.

Those skilled in the art having reference to this specification will recognize that integrated circuit 10 may include additional or alternative functions to those shown in FIG. 3, or may have its functions arranged according to a different architecture from that shown in FIG. 3. The architecture and functionality of integrated circuit 10 is thus provided only by way of example, and is not intended to limit the scope of the claims.

Figure 4:
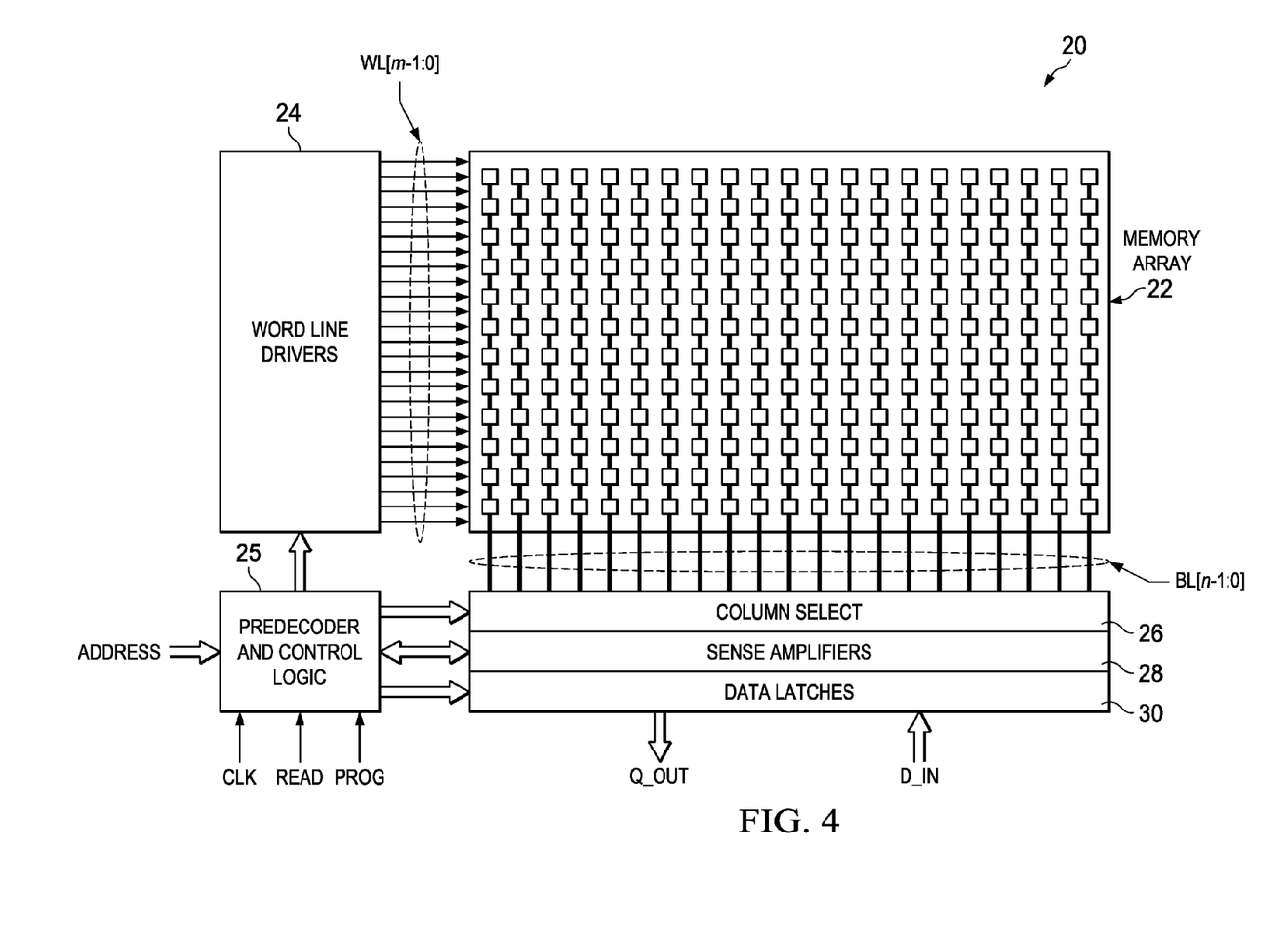
FIG. 4 is an electrical diagram, in block form, of the OTP memory in the integrated circuit of FIG. 3, constructed according to an embodiment.

FIG. 4 illustrates an example of the architecture of OTP 19 according to embodiments of this invention. While FIG. 2 illustrates OTP 19 as embedded memory within larger-scale integrated circuit 10, OTP 19 may alternatively correspond to a stand-alone memory integrated circuit. Those skilled in the art having reference to this specification will also comprehend that the memory architecture of OTP 19 in FIG. 3 is provided by way of example only, and that the memory architecture of other embodiments may vary significantly from that shown in FIG. 3.

In this example, OTP 19 includes memory array 20 containing programmable read-only memory cells arranged in rows and columns. While a single instance of memory array 20 is shown in FIG. 3, it is to be understood that OTP 19 may include multiple memory arrays 20, each corresponding to a memory block within the address space of OTP 19. In the example shown in FIG. 3, memory array 20 includes m rows and n columns of floating-gate memory cells, each of which stores one data bit. In these embodiments, cells in the same column share a single bit line BL[n−1:0], and cells in the same row share one of word lines WL[m−1:0]. Memory array 20 may be alternatively arranged to include multiple array blocks or sub-arrays of cells, depending on the addressing space or memory architecture. Predecoder and control logic block 25 includes decoder logic and other control logic for controlling the access of selected cells in memory array 20. In this embodiment, predecoder and control logic block 25 receives a memory address from external to OTP 19, for example from microprocessor 12 via bus SBUS (FIG. 3), along with a clock signal CLK, and one of enable signals READ or PROG that indicates whether a read or program operation, respectively, is to be performed. Clock signal CLK may be provided by a clock generator circuit (not shown) in integrated circuit 10, while the applicable READ and PROG signals are typically provided by the particular function in integrated circuit 10 that is accessing OTP 19 (e.g., microprocessor 12). In a general sense, predecoder and control logic block 25 operates to at least partially decode row and column portions of the received memory address upon receiving an instance of clock signal CLK, and will control the various functions within OTP 19 to carry out the desired read or program function.

In read cycles, word line driver 24 receives, from predecoder and control logic block 25, row address signals that indicate the particular row of memory array 20 to be accessed along with the appropriate timing signal. In response, word line driver 24 energizes the one of word lines WL[m−1:0] corresponding to the decoded row address value, which causes the cells in that corresponding row to present a voltage or current dependent on the data state stored in each of those cells to its corresponding bit line BL[n−1:0] for its column.

In the architecture of FIG. 4, column select circuit 26 is constructed essentially as a multiplexer to select one or more of bit lines BL[n−1:0] for coupling to sense amplifiers 28, in response to the column address (as may be at least partially decoded by predecoder and control logic block 25). The number of sense amplifiers 28 typically corresponds to the width of the output data word. Sense amplifiers 28 essentially digitize the voltage or current on the selected bit lines BL[n−1:0], and forward the result to data latches 30, for eventual buffering and presentation on data output lines Q_OUT. As will be described in further detail below, the enabling and timing of sense amplifiers 28 and data latches 30 will be based in large part on the data transitions along the data path itself.

Write circuitry (not shown) will also be provided in OTP 19 to program selected memory cells with data presented on data input bus D_IN in the conventional manner, specifically by the selective application of the proper programming voltages to selected bit lines BL[n−1:0]. It is contemplated that this write circuitry and the programming operation may be implemented in any one of a number of conventional techniques for electrically programmable memory, as known in the art. Other circuitry, including precharge and bias circuitry for precharging and biasing bit lines BL[n−1:0], generating programming voltages, control signals, and the like, will be included within OTP 19, as typical for electrically-programmable memories as will be understood by those skilled in the art having reference to this specification.

Figure 5:
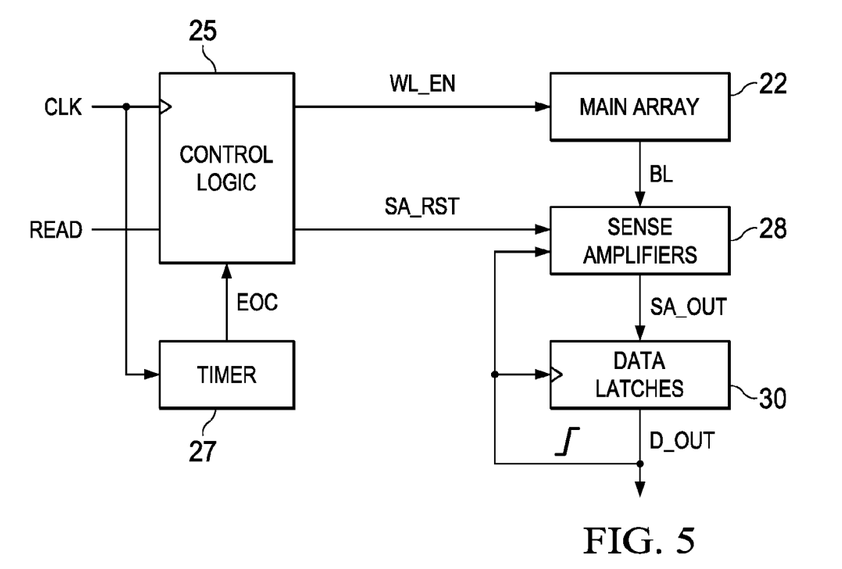
FIG. 5 is an electrical diagram, in block form, of the functional architecture of the OTP memory of FIG. 4 according to that embodiment.

FIG. 5 illustrates the functional architecture of OTP 19 in connection with the timing of the latching of sensed data in its read data path. According to these embodiments, OTP bit cells are arranged as rows and columns in main array 22, with the cells in the same row sharing a word line and the cells in the same column sharing a bit line BL in the conventional manner. At the beginning of each read cycle, bit lines BL are initialized to a particular logic level, such as the logic level exhibited by a bit cell in its unprogrammed state. Control logic 25 represents timing logic circuitry that, at the appropriate time in a read cycle (indicated by read enable signal READ) and responsive to a clock signal CLK, generates a word line enable signal WL_EN that in turn causes the energizing of a selected word line in main array 22. In the conventional manner, the cells in the selected row apply their data states to corresponding bit lines BL, selected ones of which are applied to corresponding sense amplifiers 28. Sense amplifiers 28 sense the levels at the selected bit lines BL, and present the sensed data states to corresponding data latches 30 on lines SA_OUT. According to this embodiment, each data latch 30 latches the sensed data state in response to a transition at its output D_OUT (e.g., a low-to-high transition, indicating that the corresponding cell was programmed to a "1" data state). Additionally, according to these embodiments, that same transition at the output of each data latch 30 also operates to isolate its input from its corresponding sense amplifier 28. The output data states on respective output lines D_OUT are forwarded to the destination, for example via an output buffer.

Conversely, according to these embodiments, if no transition occurs at output D_OUT (i.e., the corresponding selected memory cell in main array 22 being in its unprogrammed state), data latch 30 does not latch its data state, but remains in its initialized condition. In any case, control logic 25 resets sense amplifiers 28 and data latches 30 in advance of the next read operation, for example in response to the rising edge of clock signal CLK at the beginning of the next cycle. In those instances in which the selected cell in a read cycle is in its unprogrammed state such that no transition at the output of sense amplifier 28 occurs, leakage current may flow from the bit cell through its sense amplifier 28. According to some of these embodiments, timer 27 is provided in OTP memory 19 to measure a time out period from the initiation of a previous cycle and, upon reaching the end of that period without a new cycle starting, to cause control logic 25 to issue a sense amplifier reset signal on line SA_RST and also a reset signal to data latch 30; this time-out ensures the resetting of those sense amplifiers 28 that did not sense a data level transition in the previous cycle, eliminating this leakage path and undesired power consumption.

As a result of this operation, the latching of data in the read data path is essentially "self-timed", in the sense that a data transition in the data path itself clocks the latching of the output data. No tracking circuit or replica cells are required, avoiding the timing inaccuracies in one-time programmable memories in which the replica cells either do not match the actual cells in electrical characteristics at the time of manufacture or degrade differently from the actual cells over the operating life of the device. Indeed, the self-timing of the data path results in faster read cycle times than in the conventional memories utilizing tracking circuits, considering that the excess timing margin ($t_2$-$t_1$ margin in FIG. 2b) necessitated by the differences in replica cells is not needed.

Figure 6:
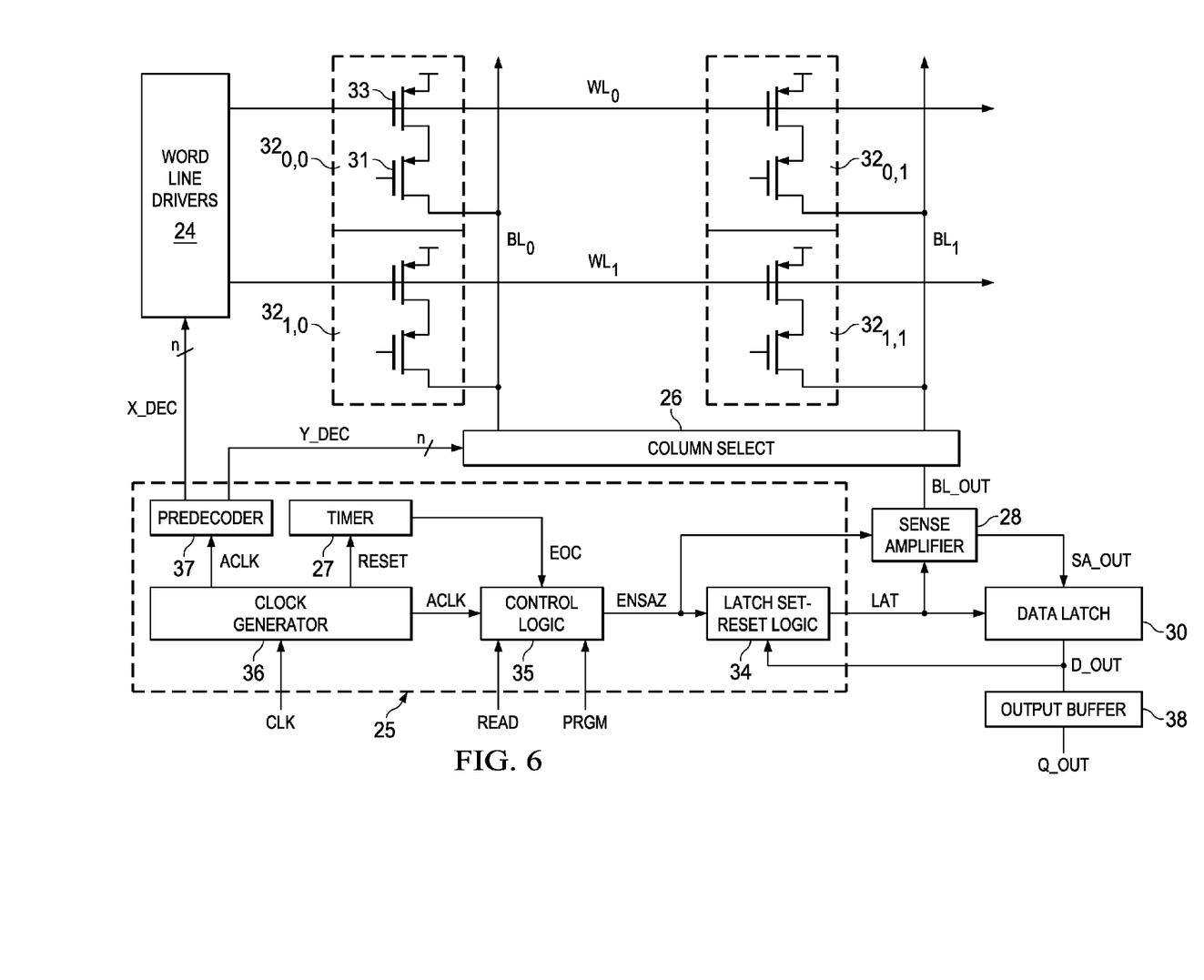
FIG. 6 is an electrical diagram, in block and schematic form, of the data path in the OTP memory of FIG. 5 according to that embodiment.

The construction of OTP 19 according to an embodiment will now be described in further detail with reference to FIG. 6 for the example of four representative bit cells 32 (i.e., bit cells $32_{0,0}$, $32_{0,1}$, $32_{1,0}$, $32_{1,1}$ as shown in FIG. 6) in array 22. It is of course contemplated that many more bit cells 32 will typically be included in a given instance of array 22, as appropriate for the program code or other contents of that memory resource in integrated circuit 10. In addition, while the arrangement of FIG. 6 illustrates a single instance of sense amplifier 28 and of data latch 30 in this read data path, by way of example, it is of course contemplated that multiple sense amplifiers 28 and data latches 30 will simultaneously be operating in the same manner in those memories in which the data word width is greater than a single bit. Those skilled in the art having reference to this specification will understand that the construction shown in FIG. 6 will be representative of that for each of the multiple instances of that circuitry.

In this embodiment, each bit cell $32_{j,k}$ includes p-channel floating-gate MOS transistor 31 with its source/drain path connected in series with that of p-channel MOS select transistor 33 between a power supply voltage (e.g., the $V_{dd}$ power supply voltage) and its corresponding bit line $BL_k$. The gate of select transistor 33 in each bit cell $32_{j,k}$ receives the word line $WL_j$ for its row; in this example, because select transistor 33 is a p-channel MOS device, word line $WL_j$ will be energized when driven to a low logic level by word line drivers 24. Word line drivers 24 energize the selected word line $WL_j$ in response to the row address signals X_DEC, which have been at least partially decoded by pre-decoder 37.

The data state of a given bit cell $32_{j,k}$ depends on whether its floating gate transistor 31 is programmed to have charge trapped on its floating-gate electrode. In this embodiment, the unprogrammed state of a bit cell $32_{j,k}$ is that state in which its floating-gate transistor 31 is not conductive, and the programmed state is that in which sufficient electrons are trapped at the floating gate electrode to render that transistor 31 conductive upon application of sufficient source-drain voltage. Accordingly, the state of floating-gate transistor 31 of bit cell $32_{j,k}$ determines the voltage at bit line $BL_k$ when its word line $WL_j$ is energized so as to turn on select transistor 33. If cell $32_{j,k}$ is programmed, conduction through transistor 31 will apply a high voltage ($V_{cc}$) to bit line $BL_j$ when word line $WL_j$ is energized and its select transistor 33 is on. Conversely, if cell $32_{j,k}$ is unprogrammed and thus non-conductive when select transistor 33 is turned on by word line $WL_j$, the $V_{cc}$ voltage will not be applied to that bit line $BL_j$. In this unprogrammed state, a selected bit cell $32_{j,k}$ will thus not consume any power other than that resulting from leakage current; this effect is used to advantage in this embodiment.

Bit lines $BL_k$ are coupled to column select circuitry 26, which receives decoded column address signals Y_DEC from pre-decoder 37 and selects one of those bit lines $BL_k$ for application to sense amplifier 28 via line BL_OUT. Sense amplifier 28 compares the voltage or read current at the selected bit line BL_OUT with a reference level, and presents a corresponding data state on line SA_OUT to data latch 30 as described above relative to FIG. 5. In this embodiment, data latch 30 is transparent during the sensing of the addressed memory cell $32_{j,k}$, and as such the sensed data level at line SA_OUT is communicated through data latch 30 to its output on line D_OUT. Output buffer 38 in turn presents that data state at its output Q_OUT, for communication to the appropriate destination in integrated circuit 10.

As shown in FIG. 6, predecoder and control logic 25 includes clock generator 36 that produces internal clock signals for OTP 19 from clock signal CLK. Clock signal CLK may be produced by clock circuitry (not shown) elsewhere in integrated circuit 10. In the read circuitry of OTP 19 according to this embodiment, the internal clock signals produced by clock generator 36 include clock signal ACLK that is applied to predecoder 37 and control logic 35, and reset signal RESET applied to timer 27, both produced, for example, after suitable times following a rising edge of clock signal CLK. As mentioned above, predecoder 37 receives the desired memory address from the requesting function in integrated circuit 10 (e.g., via bus SBUS of FIG. 3) and, in response to the clock signal ACLK from clock generator 36, at least partially decodes that memory address for use by word line drivers 24 and column select circuit 26.

Timer 27 is a conventional timer circuit that, in this embodiment, measures a maximum cycle time period beginning from the reset signal RESET from clock generator 36 at the beginning of the cycle. As will be described below in connection with its operation, OTP 19 according to these embodiments is initialized at the beginning of a read cycle, rather than at the end of the read operation as may be indicated by a tracking circuit in conventional memories. Because the data latch timing is based on a one-way transition in the read path according to the self-timing operation, reset will not otherwise occur in read cycles in which no data transition is detected, particularly if that cycle is not soon followed by another read operation. Accordingly, the operation of timer 27 ensures reset of sense amplifiers 28 and initialization of bit lines BL in array 22 after some specified maximum time-out period. For example, if the nominal read cycle period of OTP 19 is on the order of 50 nsec, a suitable time-out period measured by timer 27 may be on the order of 200 nsec or longer. Upon the expiration of the time-out period, timer 27 issues a signal EOC to control logic 35.

Control logic 35 is constructed as logic circuitry that issues control signals to various circuits in the read path according to these embodiments. As mentioned above, control logic 35 receives internal clock signal ACLK from clock generator 36, end-of-cycle signal EOC from timer 27, and the read and program control signals READ and PRGM, respectively, from microprocessor 12 or another function in integrated circuit 10, indicating the type of cycle to be performed by OTP 19. According to the embodiment of FIG. 6, control logic 35 issues an enable signal ENSAZ to latch set-reset logic 34 and to sense amplifiers 28 in response to the internal clock signal ACLK at the beginning of a read cycle (as indicated by the READ control signal); enable signal ENSAZ is also issued by control logic 35 in response to the end-of-cycle signal EOC from timer 27. According to this embodiment, and as will be described in further detail below, enable signal ENSAZ operates to reset sense amplifiers 28 and initiate reset of data latches 30.

In addition to enable signal ENSAZ, line D_OUT from the output of data latch 30 is communicated to latch set-reset logic 34. As discussed above and as will be described in further detail below, latch set-reset logic 34 issues a latch signal LAT to data latch 30 in response to a transition at line D_OUT, latching that data state into data latch 30 to allow sense amplifier 28 and the remainder of the upstream circuitry can be reset for the next cycle. As shown in FIG.

6, latch signal LAT is also applied to sense amplifier 28 to disable it responsive to the transition at line D_OUT.

Figure 7A:
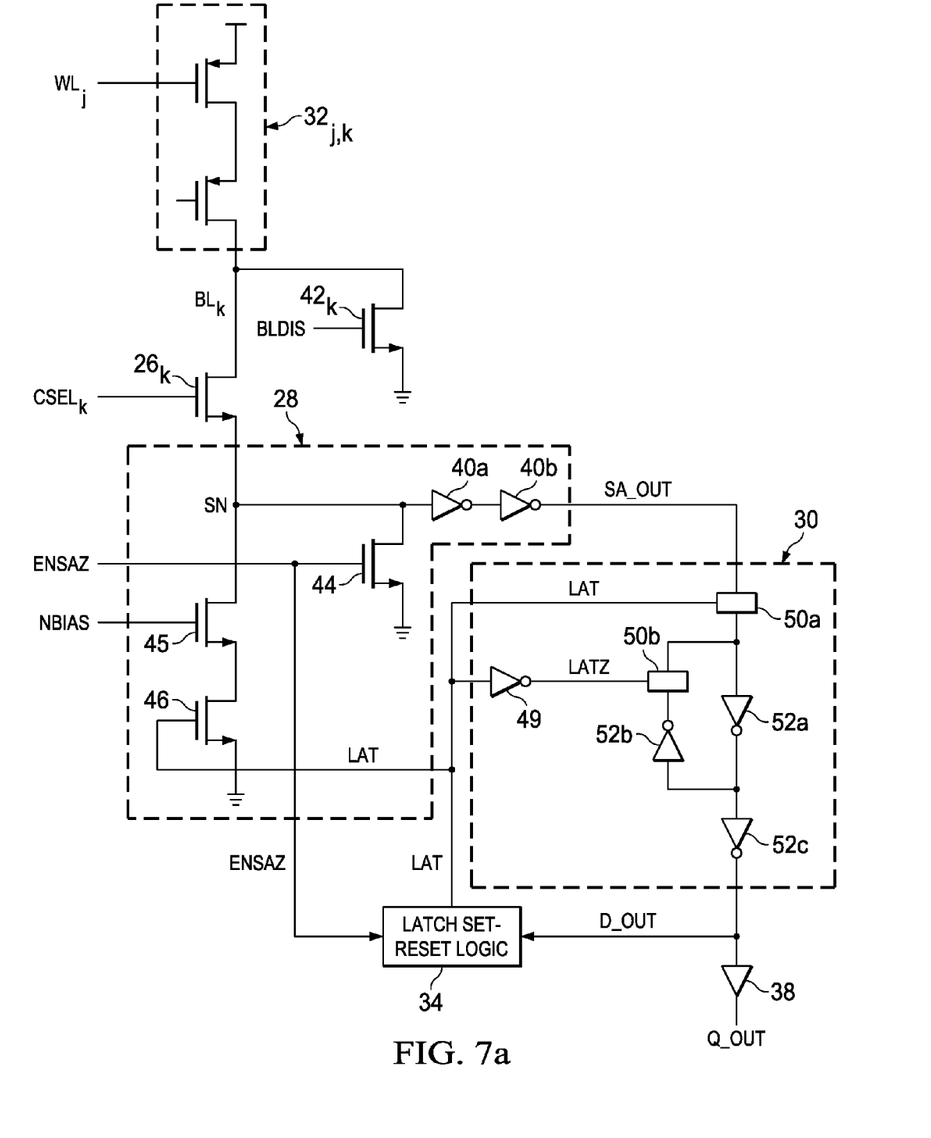
FIGS. 7a and 7b are electrical diagrams, in schematic form, of the sense amplifier, data latch, and logic circuitry in the OTP memory of FIG. 5 according to an embodiment.
Figure 7B:
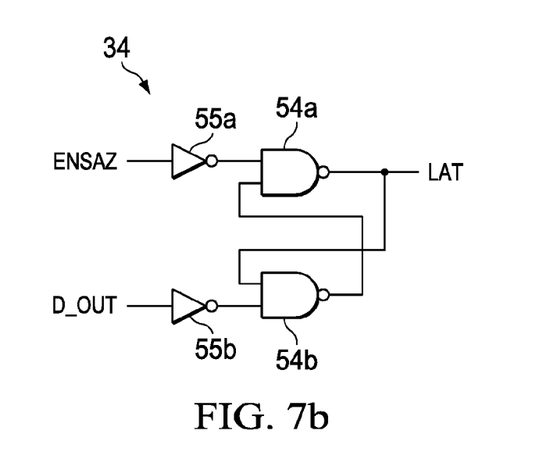

FIGS. 7a and 7b illustrate the data path circuitry of OTP 19 according to the embodiment of FIG. 6 in further detail. In FIG. 7a, a single bit cell $32_{j,k}$ is illustrated for the sake of clarity; it will of course be understood that the particular bit cell $32_{j,k}$ coupled to this instance of sense amplifier 28 will be the one corresponding to the decoded memory address. As shown in FIG. 7a, bit line $BL_k$ is associated with a corresponding precharge transistor $42_k$ having its source/drain path connected between bit line $BL_k$ and ground, and its gate receiving control signal BLDIS from control logic 35 or other appropriate circuitry in OTP 19. According to this embodiment, each bit line $BL_k$ will be initialized by its associated precharge transistor $42_k$ to a voltage corresponding to the unprogrammed state for bit cells 32, prior to the initiation of a read operation. As such, if the selected bit cell $32_{j,k}$ for bit line $BL_k$ is in the unprogrammed state, no transition will occur at bit line $BL_k$. Conversely, if selected bit cell $32_{j,k}$ is in its programmed state, bit line $BL_k$ will make a transition from its precharged level, in this embodiment from ground to a high voltage (e.g., approaching $V_{cc}$).

Column select transistor $26_k$ has its source/drain path connected between bit line $BL_k$ and its associated sense amplifier 28, and receives decoded column select signal $CSEL_k$ at its gate. If bit line $BL_k$ corresponds to the column indicated by the received column address, decoded signal $CSEL_k$ is energized, turning on transistor $26_k$ to connect bit line $BL_k$ to sense amplifier 28, at sense node SN.

Sense amplifier 28 in this embodiment is essentially a current comparator, comparing the current conducted from bit line $BL_k$ to a reference current. The reference current in sense amplifier 28 is established by reference transistor 45, which has its source/drain path connected in series with that of transistor 46 between sense node SN and ground. The gate of reference transistor 45 receives a bias voltage NBIAS from a reference circuit elsewhere in OTP 19 or integrated circuit 10, while transistor 46 receives the latch signal LAT from latch set-reset logic 34 as will be described below. Bias voltage NBIAS establishes the reference current conducted by transistors 45 and 46 in the read cycle, such that the voltage at sense node SN depends on whether the current from the selected cell $32_{j,k}$ via bit line $BL_k$ exceeds the reference current. For bit cell $32_{j,k}$ in the unprogrammed state, bit line $BL_k$ will conduct at most a leakage current, and transistors 45 and 46 will pull sense node SN to ground. For bit cell $32_{j,k}$ in its programmed (i.e., conductive) state, the bit line current will be sufficient to overcome the smaller reference current established by reference transistor 45, and the voltage of sense node SN will rise toward $V_{cc}$. Inverters 40a, 40b, connected in series between sense node SN and data latch 30, produce a logic level at the output SA_OUT of sense amplifier 28 corresponding to the voltage at sense node SN and thus to the state of selected bit cell $32_{j,k}$.

According to this embodiment, data latch 30 includes a first pass gate 50a coupled to the output SA_OUT of sense amplifier 28 and controlled by latch signal LAT from latch set-reset logic 34. Pass gate 50a may be constructed as a pair of complementary MOS transistors with their source/drain paths in parallel and receiving complementary signals at their respective gates (i.e., latch signal LAT and its complement LATZ, in this example) as known in the art, or alternatively may be a single pass transistor. The opposite side of pass gate 50a is connected to the input of inverter 52a, which has its output connected to an input of each of inverters 52b, 52c. Pass gate 50b connects the output of inverter 52b to the input of inverter 52a to form a latch when pass gate 50b is conductive. In this embodiment, pass gate 50b receives complement latch signal LATZ, generated from latch signal LAT by inverter 49. As such, pass gate 50b is off when pass gate 50a is on (with latch signal LAT at a high logic level), and pass gate 50a is off when pass gate 50b is on (with latch signal LAT at a low logic level). Latch output D_OUT at the output of inverter 52c is applied to output buffer 38 and to latch set-reset logic 34.

FIG. 7b illustrates the construction of latch set-reset logic 34 according to this embodiment. Latch set-reset logic 34 includes a pair of cross-coupled NAND gates 54a, 54b, each having an input receiving the output of the other. The other input of NAND gate 54a receives the logical complement (via inverter 55a) of enable signal ENSAZ from control logic 35 (FIG. 6). The other input of NAND gate 54b receives the logical complement (via inverter 55b) of latch output D_OUT. Accordingly, latch set-reset logic 34 is operable to assert latch signal LAT in response to a high logic level at either enable signal ENSAZ or at latch output D_OUT.

Of course, latch set-reset logic 34 may be realized by other logic circuit arrangements to carry out the functions of control logic 25 according to these embodiments. For example, in the embodiment shown in FIG. 7a, latch signal LAT from latch set-reset logic 34 is applied to the gate of transistor 46 in sense amplifier 28, simplifying the logic arrangement of this circuitry for efficient implementation. Alternatively, control logic 25 may be arranged to disable sense amplifier 28 (e.g., by turning off its transistor 46) separately from the setting and resetting of data latch 30. It is contemplated that those skilled in the art will be readily able to realize the particular arrangement of control logic 25, including latch set-reset logic 34, in the manner desired for each specific implementation of these embodiments.

Figure 8:
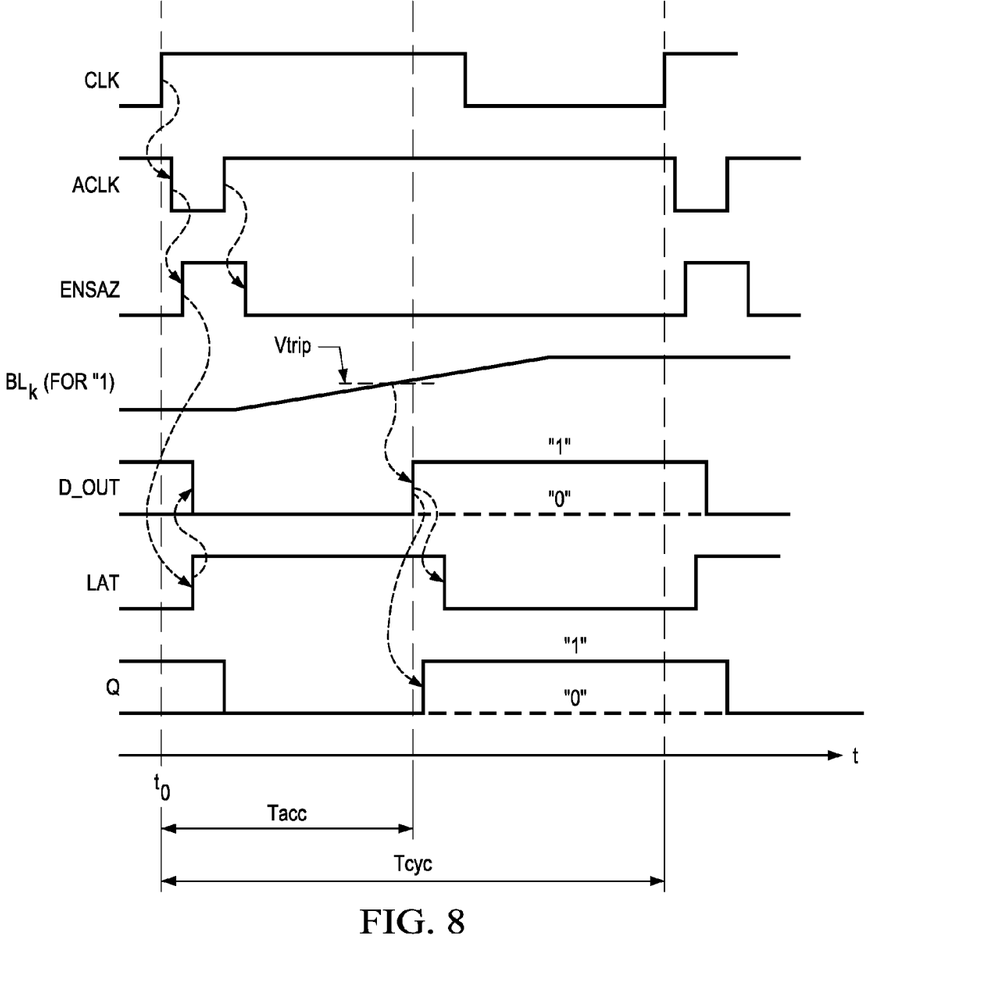
FIG. 8 is a timing diagram illustrating the sense amplifier and data latch timing of the OTP memory of FIG. 5 according to an embodiment.

Referring now to FIG. 8, an example the operation of the read path architecture of OTP 19 according to the embodiment of FIGS. 6, 7a, and 7b in carrying out a read cycle will now be described, specifically for the case of an OTP cell $32_{j,k}$ programmed to a "1" data state (i.e., having charge trapped at the floating-gate of transistor 31 to render it conductive). As will be apparent from this description, in the previous read cycle and thus prior to the beginning of the read cycle at time to, latch set-reset logic 34 has issued latch signal LAT at a logic low level. In data latch 30, pass transistor 50a is thus off and pass transistor 50b is on, such that data latch 30 is retaining the previous data state D_OUT and presenting the corresponding logic level at its output D_OUT.

In this example, the read cycle begins with a rising edge of clock signal CLK applied to clock generator 36 (FIG. 6), in response to which clock generator 36 issues a trailing edge of internal clock signal ACLK to predecoder 37 and control logic 35 to initiate the cycle. As described above relative to FIG. 7a, bit lines $BL_k$ are each precharged to ground, for example by control circuitry briefly asserting signal BLDIS to turn on transistors $42_k$ in response to this transition of internal clock signal ACLK. The high-to-low transition of internal clock signal ACLK also causes predecoder 37 to begin the decoding of the received row and column addresses, for example from system bus SBUS, for application to word line drivers 24 and column select circuit 26, which in turn respectively initiate the access of the selected row of cells and the selection of those bit lines $BL_k$ that are to be sensed. In this example, the selected cell $32_{j,k}$ in row j and column k is in its programmed ("1") state, and as such will pull its selected bit line $BL_k$ to a high voltage for sensing.

In a read cycle (i.e., with read signal READ asserted) and in response to internal clock signal ACLK, control logic 35 issues a pulse of enable signal ENSAZ to sense amplifier 28 and latch set-reset logic 34. In this embodiment of the invention, this enable signal ENSAZ pulse initializes each sense node SN to a low level by turning on transistor 44 in each sense amplifier 28. In addition, as shown in FIG. 8, the rising edge of the ENSAZ pulse causes latch set-reset logic 34 to issue a rising edge of latch signal LAT to sense amplifier 28 and data latch 30 according to this embodiment. The high level of latch signal LAT turns on transistor 46 in sense amplifier 28, allowing conduction of the reference current from sense node SN through transistor 45, under the control of bias voltage NBIAS. In addition, latch signal LAT "resets" data latch 30 by turning on its pass gate 50a and turning off its pass gate 50b. In this "reset" state, the previous state stored in data latch 30 is no longer latched, and the current level at sense amplifier output SA_OUT passes through data latch 30 via inverters 50a, 50c.

At the end of the pulse of enable signal ENSAZ, as determined by control logic 35, transistor 44 is turned off so that sense node SN is no longer held at ground except through reference transistor 45. Accordingly, the voltage at selected bit line $BL_k$, as determined by the data state of the selected cell $32_{j,k}$, will be reflected at sense node SN to the extent that the read current through selected cell $32_{j,k}$ exceeds the reference current through transistor 45. For the "1" state, as described above, the read current will exceed the reference current, and sense node SN will be pulled up to a high level with bit line $BL_k$. Referring to FIG. 8, in response to bit line $BL_k$ (and thus sense node SN) reaching the trip voltage Vtrip of inverter 40a of sense amplifier 28, sense amplifier output SA_OUT makes a transition to a high logic level as driven by inverter 40b. With pass gate 50a in data latch 30 turned on (latch signal LAT being high at this time), the high logic level at sense amplifier SA_OUT is reflected at latch output D_OUT following the propagation delay through inverters 52a, 52c. Access time Tacc shown in FIG. 8 refers to the time interval between the rising edge of clock signal CLK and the low-to-high transition at latch output D_OUT. Because data latch 30 is transparent during the sense operation, this access time Tacc essentially depends on the read current supplied by the addressed memory cell $32_{j,k}$ in its "1" data state. Buffer 38 then presents that high logic level on line Q_OUT in the data path of OTP 19.

According to this embodiment, latch set-reset logic 34 terminates the pulse of latch signal LAT in response to the low-to-high transition at latch output D_OUT. Specifically, the trailing edge of latch signal LAT "sets" data latch 30 by turning off pass gate 50a and turning on pass gate 50b, such that the output of inverter 52b is coupled to the input of inverter 52a. The sensed "1" data state is latched into and retained by data latch 30 in this "set" state, and is no longer influenced by the level at sense amplifier output SA_OUT. In addition, also according to this embodiment, transistor 46 in sense amplifier 28 is turned off, ending the sense operation for this cycle.

In this state, as described above, the low level of latch signal LAT maintains sense amplifier 28 off and data latch 30 de-coupled from sense amplifier SA_OUT. Precharge transistor $42_k$ is turned on to initialize bit line $BL_k$ in the next cycle, and as such the programmed selected cell $32_{j,k}$ draws no current other than leakage current. Data latch 30 maintains the "1" data state at data output line Q for the remainder of the cycle. This state is maintained until the next rising edge of clock signal CLK, which starts the next cycle for OTP 19.

For the case of a unprogrammed ("0") cell $32_{j,k}$, the operation of OTP 19 is similar to that described above relative to FIG. 8, except that no transition occurs at sense amplifier output SA_OUT, and therefore no transition occurs at latch output D_OUT. No pulse of latch signal LAT is thus generated by latch set-reset logic 34. Data latch 30 remains unlatched in this case (pass gate 50b remains off), and simply passes the low logic level at sense amplifier output SA_OUT to buffer 38 for presentation at data output Q_OUT. Since the pulse of latch signal LAT is not terminated for this "0" data state case, transistor 46 remains on and thus sense amplifier 28 remains on for the duration of the cycle. Any leakage current through the "0" state cell $32_{j,k}$ will thus be conducted along bit line $BL_k$ and through transistors 45 and 46 to ground. Because floating-gate transistor 33 in the selected cell $32_{j,k}$ is not held off with a hard gate voltage, however, it is contemplated that some leakage current can occur from some of the cells 32 in array 22. While this leakage may not be significant over relatively short cycle times (i.e., between rising edges of clock signal CLK, shown as Tcyc in FIG. 8), the leakage power consumed can be significant in long cycle times, which can frequently occur for OTP 19 given its static nature. For example, the last cycle in a burst read of OTP 19 can be quite long, extending from the end of one burst until the beginning of the next.

According to this embodiment, timer 27 is provided within control logic 25 to initiate a reset of sense amplifiers 28 and data latches 30, if not occurring in response to a data transition, after a maximum allowable cycle time interval elapses. Timer 27 may be constructed in the conventional manner, for example as a countdown (or count-up) timer that advances its stored contents with each cycle of a periodic clock signal. In the embodiment of FIG. 6, timer 27 receives a reset clock RESET from clock generator 36 in response to each rising edge of clock signal CLK. This transition of reset clock RESET causes timer 27 to begin measuring a time interval corresponding to a maximum cycle time, for example by executing a countdown (or up-count) of clock pulses. An example of the maximum cycle time may be on the order of 200 nsec; typical cycle times in normal operation of an OTP are typically on the order 50 nsec or less. Typically, timer 27 will be clocked by a higher frequency clock, for example as may be generated by clock generator 36. Upon reaching the pre-programmed or selected maximum time interval, timer 27 then issues an end-of-cycle signal EOC to control logic 35, which in turn issues a pulse of enable signal ENSAZ to latch set-reset logic 34. In response to the ENSAZ pulse, as described above latch set-reset logic 34 issues a pulse of latch signal LAT, setting data latch 30 to store the "0" data state at sense amplifier output SA_OUT, and turning off sense amplifier 28 by turning off transistor 46. With sense amplifier 28 disabled in this manner, any leakage current through unprogrammed "0" cell $32_{j,k}$ will be blocked by the off-state transistor 46 from communication to ground, and excess power consumption will be minimized.

Accordingly, these embodiments operate to "self-latch" the sensed data state of the selected OTP cell, at a timing corresponding to transition of the sensed data state itself. No tracking circuit or replica cells are required for controlling the timing of the data latch, as in conventional OTP memories. As a result, the self-timing of the data latch can essentially be as fast as the operation of the memory itself, and need not include the excessive timing margin of conventional tracking circuits that must allow for variations between the replica cells or other delay circuits with the performance of the OTP cells over the operating life of the device. Rather, as the OTP cell performance may degrade over the operating life, the self-latching operation according to these embodiments will precisely follow any such degradation. Referring to FIG. 2a, the cycle time Tcyc of OTP 19 according to these embodiments can be minimized, because the need to include "$t_2$-$t_1$ margin" as shown in FIGS. 2a and 2b is eliminated according to these embodiments. In addition, these embodiments implement the self-latching read data path in a manner that minimizes excessive power consumption, and that can be efficiently realized, from the standpoint of chip area and circuit complexity, in modern integrated circuits.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A programmable solid-state memory, comprising:
a memory array having a plurality of memory cells arranged in rows and columns, each column of memory cells associated with a bit line, each memory cell programmable from a first data state to a second data state;
a sense amplifier, having an input coupled to one of the bit lines, for presenting, at an output, a signal corresponding to a data state of a selected memory cell coupled to the bit line;
a data latch having an input coupled to the output of the sense amplifier, the data latch operable in a reset state to pass the output of the sense amplifier to an output data path, and operable in a set state to store the data state and isolate its input from the sense amplifier; and
latch set-reset logic, coupled to the output of the data latch, for placing the data latch in its set state responsive to the sense amplifier sensing the second data state from the selected memory cell.

2. The memory of claim 1, wherein the latch set-reset logic is also for placing the data latch in its reset state responsive to receiving an enable signal corresponding to a start of a read cycle.

3. The memory of claim 2, further comprising:
control logic, coupled to the latch set-reset logic and to the sense amplifier, for generating the enable signal responsive to a clock signal;
and wherein the control logic resets the sense amplifier responsive to the clock signal.

4. The memory of claim 3, further comprising:
a timer, for generating an end-of-cycle signal at a maximum cycle time;
wherein the latch set-reset logic generates the enable signal responsive to the end-of-cycle signal.

5. The memory of claim 1, wherein the data latch comprises:
a storage element having an input, and having an output coupled to the output data path; and
a first pass gate coupled between the output of the sense amplifier and the input of the storage element;
wherein the latch set-reset logic has an input coupled to the output of the storage element, an is configured to open the first pass gate responsive to a transition at the output of the storage element corresponding to the sense amplifier sensing the second data state.

6. The memory of claim 5, wherein the storage element of the data latch comprises:
a first inverter having an input coupled to the first pass gate and an output;
a second inverter hacing an input coupled to the output of the first inverter and an output; and
a second pass gate couple between the output of the second inverter annd the input of the first inverter;
wherein the latch snet-reset logic is also configured to close the second pass gate responsive to a transition at the output of the storage element corresponding to the sense amplifier sensing the second data state.

7. The memory of claim 6, wherein the latch set-reset logic is also configured to close the first pass gate and open the second pass gate of the data latch responsive to receiving the enable signal corresponding to the start of the read cycle.

8. The memory of claim 1, further comprising:
row select circuitry, for applying the data states of memory cells in a selected row of the memory array to their associated bit lines; and
column select circuitry, for coupling a selected one of a plurality of bit lines to the sense amplifier responsive to a column address.

9. The memory of claim 1, wherein the first data state corresponds to an unprogrammed memory cell state;
and wherein the second data state corresponds to a programmed memory cell state.

* * * * *